United States Patent
Lenive et al.

(10) Patent No.: US 9,318,432 B2
(45) Date of Patent: Apr. 19, 2016

(54) SHIELDED SYSTEM

(71) Applicant: Qualcomm Technologies International, Ltd., Cambridge (GB)

(72) Inventors: Vlad Lenive, Sawston (GB); Terence Chi-Fung Kwok, London (GB)

(73) Assignee: Qualcomm Technologies International, Ltd., Cambridge (GB)

( * ) Notice: Subject to any disclaimer, the term of this patent is extended or adjusted under 35 U.S.C. 154(b) by 179 days.

(21) Appl. No.: 13/665,542

(22) Filed: Oct. 31, 2012

(65) Prior Publication Data

US 2014/0118963 A1    May 1, 2014

(51) Int. Cl.
*H05K 9/00* (2006.01)
*H01L 23/522* (2006.01)
*H01F 17/00* (2006.01)

(52) U.S. Cl.
CPC ........ *H01L 23/5227* (2013.01); *H01F 17/0006* (2013.01); *H01L 23/5225* (2013.01); *H01F 2017/008* (2013.01); *H01L 2924/0002* (2013.01)

(58) Field of Classification Search
CPC .................................. H05K 9/00; H05K 7/00
USPC .................................. 361/800, 748; 257/531
See application file for complete search history.

(56) References Cited

U.S. PATENT DOCUMENTS

| | | | | |
|---|---|---|---|---|
| 4,641,901 | A * | 2/1987 | Brennan et al. | 439/344 |
| 6,777,774 | B2 * | 8/2004 | Beng et al. | 257/531 |
| 7,323,948 | B2 * | 1/2008 | Ding | H01L 23/5223 257/531 |
| 8,003,529 | B2 * | 8/2011 | Lim et al. | 438/657 |
| 2002/0096736 | A1 * | 7/2002 | Brennan et al. | 257/531 |
| 2003/0142482 | A1 * | 7/2003 | Forte et al. | 361/737 |
| 2003/0197243 | A1 | 10/2003 | Beng et al. | |
| 2004/0007760 | A1 * | 1/2004 | Lowther | H01L 28/10 257/531 |
| 2006/0202789 | A1 * | 9/2006 | Hyvonen | 336/200 |
| 2006/0229683 | A1 * | 10/2006 | Wang et al. | 607/9 |
| 2008/0237789 | A1 * | 10/2008 | He et al. | 257/531 |

OTHER PUBLICATIONS

Search Report issued Mar. 24, 2014 in corresponding application GB1300010.4.

* cited by examiner

*Primary Examiner* — Dion R Ferguson
*Assistant Examiner* — Mandeep S Buttar
(74) *Attorney, Agent, or Firm* — Mahamedi Paradice LLP

(57) ABSTRACT

A shielded system for reducing energy dissipation from an RF component into a semiconductor substrate, the shielded system comprising: a semiconductor substrate; an RF component in connection with the semiconductor substrate; an electrically connected shielding structure having a galvanic connection to ground or the semiconductor substrate, the electrically connected shielding structure being electrically connected to the RF component; and an electrically isolated shielding structure having no galvanic connection to ground, the semiconductor substrate or the RF component.

20 Claims, 7 Drawing Sheets

SHIELDED SYSTEM

The following disclosure relates to a shielded system comprising a semiconductor substrate and a radio frequency (RF) component, and in particular to an arrangement which reduces dissipation of energy from the RF component into the semiconductor substrate.

RF components such as inductors, baluns and capacitors are staple features of integrated circuits. Incorporation of RF components onto the same silicon substrate that carries the remainder of an integrated circuit, a so-called "single chip" implementation, is desirable for many reasons, primarily to aid the ever-present desire to reduce the overall size of the chip package. In such implementations, RF currents existing inside the RF components induce currents in the silicon substrate. This energy dissipation into the silicon substrate causes increased insertion loss (IL), reduced Q-factor (Q), increased parasitic coupling through the silicon substrate (PCS), and reduced self resonance frequency (SRF) of the RF component.

The problem of current dissipation into the silicon substrate has been addressed by incorporating a conductive grate to shield the silicon substrate from the inductor. FIG. 1 illustrates an exploded view of such an arrangement. The silicon substrate 1 carries inductor 2. Conductive grate 3 is positioned underneath the inductor. Either the end terminals of the inductor T1 and T2, or alternatively the mid-point terminal of the inductor T3, is connected to the conductive grate's terminal T4. The conductive grate's terminal T4 is in turn connected to the ground rail (GND). The conductive grate shields the electric field of the inductor preventing it from penetrating the surrounding silicon substrate, thus enabling control of the RF currents that propagate into the silicon substrate by suitable choice of the construction of the conductive grate. Thus, the increase in insertion loss (IL) and increase in parasitic coupling through the silicon substrate (PCS) due to the RF component can be reduced by suitable choice of the construction of the conductive grate.

However, the introduction of the conductive grate 3 into the structure has undesirable effects. The conductive grate causes a lower self resonance frequency (SRF) of the RF component, leading to the insertion loss (IL) being frequency dependent. FIG. 2 illustrates the performance (Q-factor) of two figure-of-8 inductors embedded in a silicon substrate, both with and without the shielding conductive grate 3. The solid-line plot (F8B) and the solid-line-with-dots plot (F8A) show Q-factor measurements against frequency for two figure-of-8 inductors which were unshielded. These plots are identical. The solid-line-with-dashes plot (F8C) and the solid-line-with-crosses plot (F8D) show Q-factor measurements against frequency for two figure-of-8 inductors which were shielded with a conductive grate 3. These plots show that introduction of the shield increases the Q-factor over the frequency range 2 to 8 GHz. The frequency range where the Q-factor is better than 10 has increased by about 1 GHz as a result of introducing the shield. However, the frequency at the maximum Q-factor has shifted by about 1 GHz. The SRF (self resonance frequency) is derivable from FIG. 2 as the frequency at which the curve is touching the null. In the example of FIG. 2, the SRF is 10 GHz for F8C, F8D and 14.5 GHz for F8A. Thus, the SRF has reduced by a factor of 1.45 as a result of introducing the shield.

The greater the effectiveness of the conductive grate shield at reducing IL and PCS, the higher the shift in the SRF and the higher the shift in frequency at the maximum Q-factor. Thus, the effectiveness of the shielding that can be applied is limited by the frequency shift to the SRF and the maximum Q-factor that is acceptable in the integrated circuit.

Thus, there is a need for a shielded system which reduces the parasitic coupling through the silicon substrate (PCS) and insertion loss (IL) which result from the RF component, without significantly shifting the self resonance frequency (SRF) and frequency at the maximum Q-factor of the RF component.

According to a first aspect, there is provided a shielded system for reducing energy dissipation from an RF component into a semiconductor substrate, the shielded system comprising: a semiconductor substrate; an RF component in connection with the semiconductor substrate; an electrically connected shielding structure having a galvanic connection to ground or the semiconductor substrate, the electrically connected shielding structure being electrically connected to the RF component; and an electrically isolated shielding structure having no galvanic connection to ground, the semiconductor substrate or the RF component.

Suitably, each of the electrically connected shielding structure, the electrically isolated shielding structure and the RF component is located in a respective non-overlapping layer of the shielded system.

Suitably, the electrically connected shielding structure and the electrically isolated shielding structure are planar structures.

Suitably, the electrically connected shielding structure is parallel to the RF component.

Suitably, the electrically isolated shielding structure is parallel to the RF component.

Suitably, the electrically connected shielding structure comprises a perforated grate.

Suitably, the electrically connected shielding structure comprises a patterned grate.

Suitably, the electrically isolated shielding structure comprises a plurality of isolated conductive elements located in close proximity to each other.

Suitably, the plurality of isolated conductive elements have no galvanic connection to each other.

Suitably, the electrically connected shielding structure comprises a plurality of connected conductive elements located in close proximity to each other.

Suitably, the plurality of connected conductive elements are galvanically connected to each other.

Suitably, the electrically isolated shielding structure comprises two interleaving conductive grates, the interleaving conductive grates having no galvanic connection to each other.

Suitably, the RF component, the electrically connected shielding structure and the electrically isolated shielding structure are embedded in the semiconductor substrate.

Suitably, the electrically connected shielding structure and the electrically isolated shielding structure are embedded in the semiconductor substrate and the RF component is not embedded in the semiconductor substrate.

Suitably, none of the RF component, the electrically connected shielding structure and the electrically isolated shielding structure are embedded in the semiconductor substrate.

Suitably, the semiconductor substrate is fabricated from silicon.

Suitably, the RF component is an inductor.

Suitably, the electrically isolated shielding structure is positioned between the RF component and the electrically connected shielding structure.

Suitably, the electrically connected shielding structure is positioned between the RF component and the electrically isolated shielding structure.

According to a second aspect, there is provided an integrated circuit comprising the shielded system.

The present disclosure will now be described by way of example with reference to the accompanying drawings. In the drawings.

The following description uses illustrative examples in which the RF component in connection with the semiconductor substrate is an inductor. It will be apparent to the person having ordinary skill in the art that these examples extend to any suitable RF component, for example a balun or a capacitor. Furthermore, the semiconductor substrate described in the following examples is a silicon substrate. It will be apparent to the person having ordinary skill in the art that these examples extend to any semiconductor substrate suitable for carrying an RF component.

Figure 3:
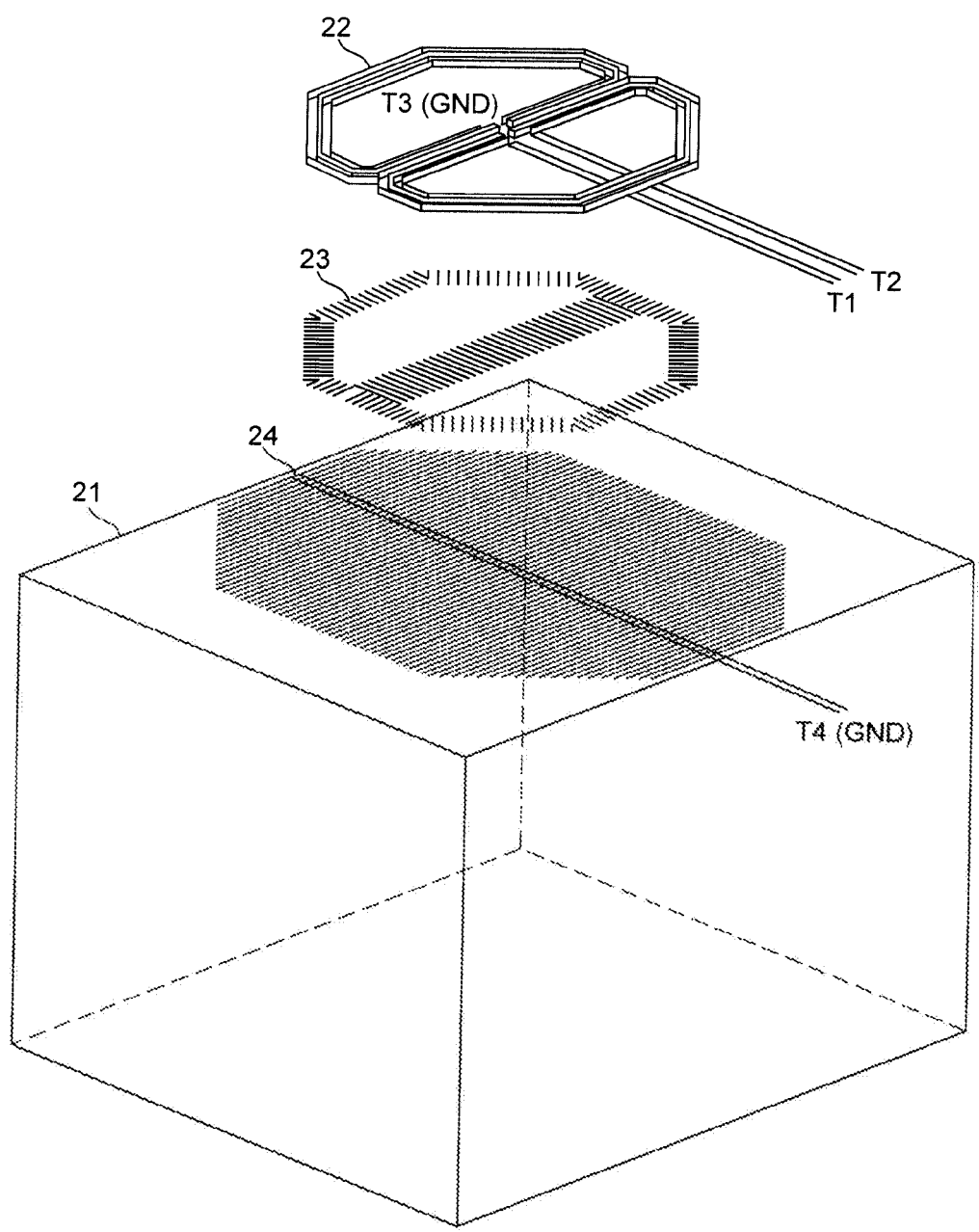
FIG. 3 illustrates a shielding arrangement comprising a figure-of-8 inductor and two shields.

FIG. 3 illustrates an exploded view of an exemplary shielded system. Inductor 22 is manufactured on silicon substrate 21. Shielding structures 23 and 24 are positioned underneath the inductor. Suitably, the inductor is connected to other components on an integrated circuit. The shielding structures 23 and 24 are located in between the inductor 22 and the silicon substrate. Shielding structure 23 is positioned in between inductor 22 and shielding structure 24. Either the end terminals of the inductor T1 and T2, or alternatively the mid-point terminal of the inductor T3, is connected to the shielding structure's 24 terminal T4. In the specific example of FIG. 3, it is preferable that the mid-point terminal of the inductor T3 is connected to the shielding structure's 24 terminal T4. This is because the inductor is a figure-of-8 differential inductor. The shielding structure's 24 terminal T4 is in turn connected to the ground rail (GND). Shielding structure 24 is referred to from hereon as the electrically connected shielding structure, or connected shield for short, because it has a galvanic connection either to ground or to the silicon substrate. The shielding structure 23 is not connected electrically to ground, the silicon substrate or the inductor. The shielding structure 23 is floating i.e. not connected. The shielding structure 23 is referred to from hereon as the electrically isolated shielding structure, or isolated shield for short.

Figure 4:
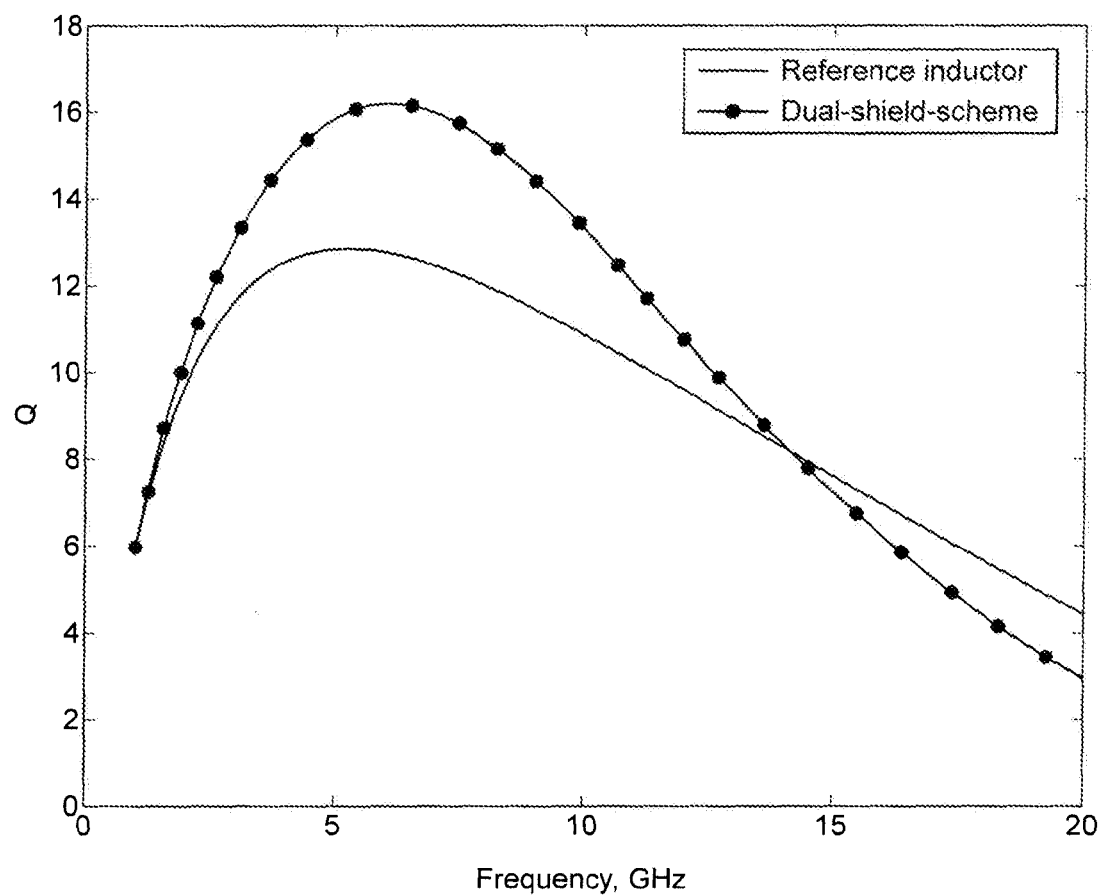
FIG. 4 illustrates the Q-factors of figure-of-8 inductors embedded in a silicon substrate both with two shields and no shields.

FIG. 4 illustrates measured Q-factors of an inductor which was embedded in a silicon substrate with no shielding (the solid-line plot referred to in FIG. 4 as "reference inductor"), and measured Q-factors of a matching inductor which was embedded in a silicon substrate with an isolated shield and a connected shield as described in reference to FIG. 3 (the solid-line-with-dots plot referred to in FIG. 4 as "dual-shield scheme"). The shielding arrangement leads to an increase in Q-factor up to 14 GHz. There is no identifiable reduction in self resonance frequency (SRF) and a negligible shift in the frequency at the maximum Q-factor.

Suitably, the isolated shield is located in a layer of the shielding system that is non-overlapping with layers which comprise the RF component and connected shield. Suitably, the isolated shield is planar. Suitably, the isolated shield is parallel to the RF component. Suitably, the isolated shield is parallel to the connected shielding structure.

Suitably, the connected shield is located in a layer of the shielding system that is non-overlapping with layers which comprise the RF component and the isolated shield. Suitably, the connected shield is planar. Suitable, the connected shield is parallel to the RF component. Suitable, the connected shield is parallel to the isolated shield.

As depicted in FIG. 3, suitably the shape of the isolated shield reflects the shape of the RF component. So, for example, in FIG. 3 the RF component is a figure-of-8 inductor, and the isolated shield has a matching figure-of-8 shape. The isolated shield is aligned with the inductor in planes perpendicular to the plane of the inductor. Thus, from the perspective of the connected shield, the inductor is fully obscured by the isolated shield.

Figure 5:
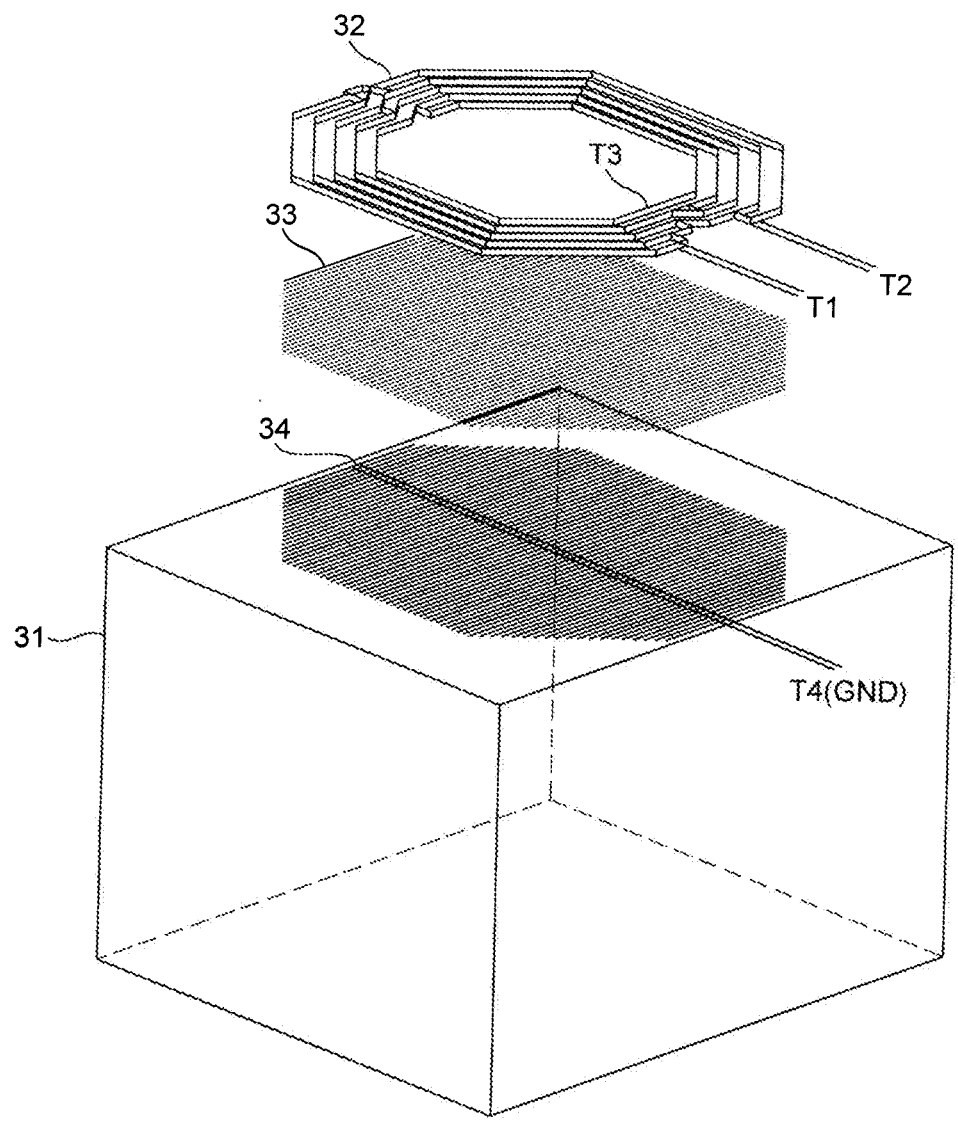
FIG. 5 illustrates a shielding arrangement comprising a spiral inductor and two shields.

Alternatively, the isolated shield may reflect the external boundary of the RF component. For example, as depicted in FIG. 5, the RF component 32 is a spiral inductor which has 8 external sides. The isolated shield 33 has a matching external boundary with 8 external sides. The isolated shield is aligned with the inductor in planes perpendicular to the plane of the inductor. The internal layout of the isolated shield does not match the RF component. The area inside the spiral inductor is hollow, whereas the area inside the external boundary of the isolated shield is uniformly populated. The isolated shield is, however, arranged such that from the perspective of the connected shield 34, the inductor is fully obscured by the isolated shield. With the exception of the shape of the isolated shield 33 and the shape of the inductor 32, the shielded system of FIG. 5 is arranged as described with reference to FIG. 3.

The shape of the connected shield is such that from the perspective of the underlying integrated circuit, the RF component and the isolated shield are fully obscured. Suitably, the connected shield has an external boundary which matches the external boundary of the isolated shield. Preferably, the connected shield is aligned with the isolated shield in planes perpendicular to the plane of the isolated shield. Suitably, the connected shield has an external boundary which matches the external boundary of the RF component. Preferably, the connected shield is aligned with the RF component in planes perpendicular to the plane of the RF component.

The compositions of the isolated shielding structure and the connected shielding structure are configurable depending on the requirements of the RF component's performance.

Figure 6:
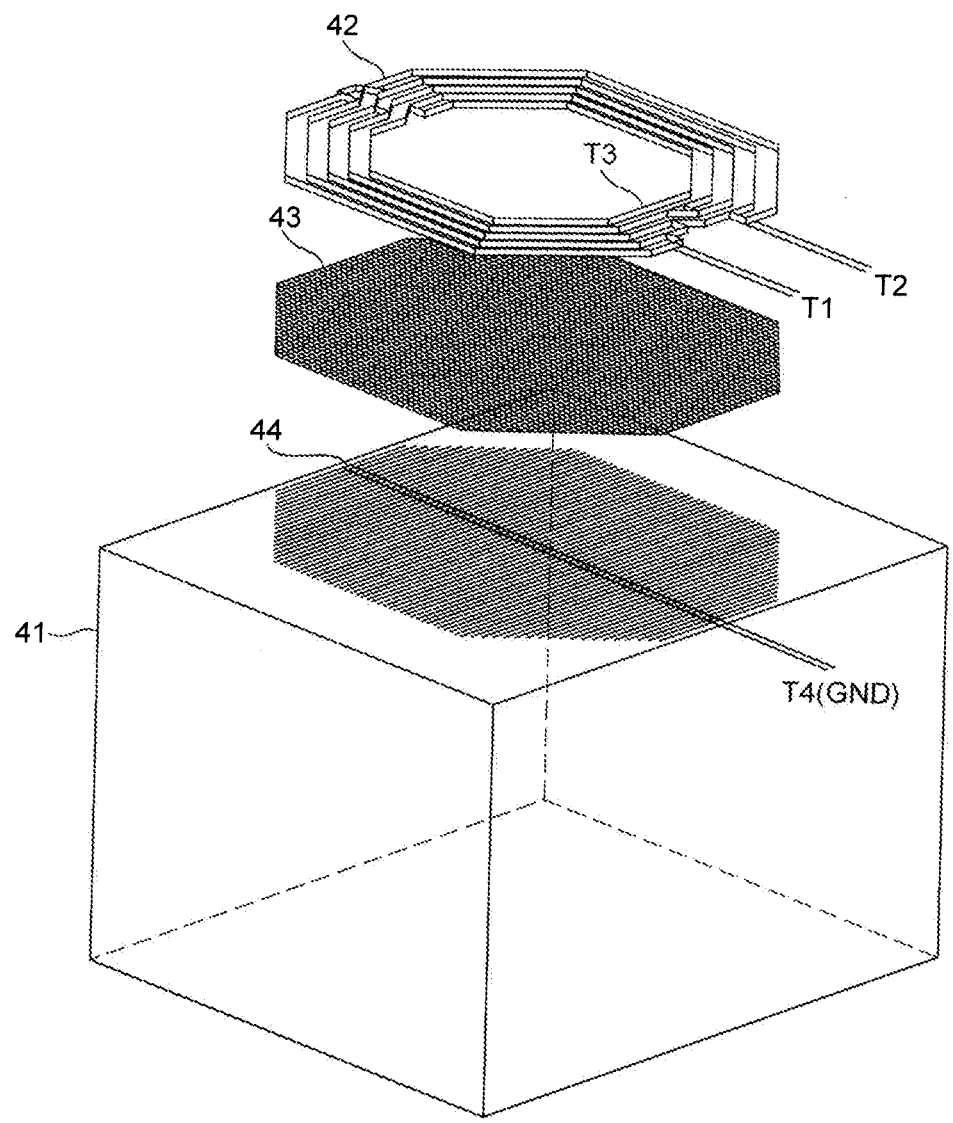
FIG. 6 illustrates a shielding arrangement comprising a spiral inductor and two shields, one of which comprises a plurality of conductive elements.

Suitably, the isolated shielding structure is a conductive grate. The isolated shielding structure suitably comprises a plurality of isolated conductive elements in close proximity to each other. These isolated conductive elements are not galvanically connected. This composition is illustrated in FIG. 6, in which the isolated shielding structure 43 can be seen to consist of a plurality of closely packed isolated conductive elements. The isolated conductive elements form an array in which the constituent elements have an optimized shape, density and orientation to achieve the desired performance. Each element within the array is floating, i.e. it has no galvanic connection to ground, the semiconductor substrate or the RF component. With the exception of the composition of the isolated shield, the shielded system of FIG. 6 is arranged as described with reference to FIG. 5. Alternatively, the isolated shielding structure comprises a perforated layout or a patterned layout. Alternatively, the isolated shielding structure comprises multiple connected elements.

Suitably, the connected shielding structure is a conductive grate. Suitably, the connected shielding structure has electrically connecting lines to equalize the electrical potential of the connected shielding structure elements. Preferably, the electrically connected shielding structure has a perforated layout or a patterned layout. The perforated structure prevents eddie currents from flowing inside the connected shielding structure, thus minimizing the RF losses, while still maintaining equal electrical potential across the shield elements. Suitably, the connected shielding structure comprises a plurality of connected conductive elements located in close proximity to each other. These connected conductive elements are galvanically connected.

The connected conductive elements and the isolated conductive elements in the shields may be particles, strips or fragments of arbitrary shapes. Preferably, the isolated shield has a different composition to the composition of the connected shield. This implementation in which shields have different compositions enables each shield to be used to address a different aspect of the performance of the RF component. Alternatively, the isolated shield may have the same composition as the composition of the connected shield.

Figure 7:
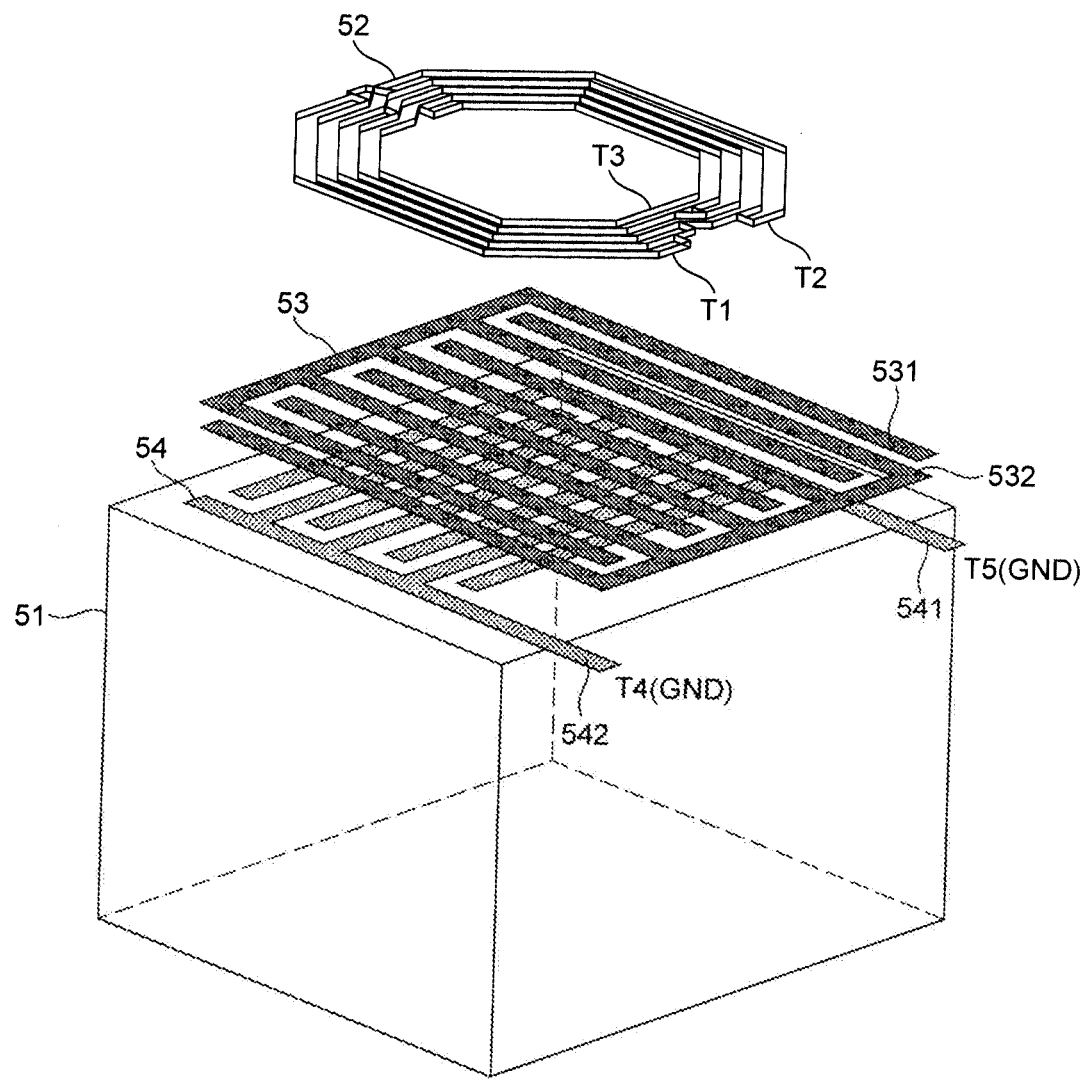
FIG. 7 illustrates a shielding arrangement comprising a spiral inductor and two shields, each of which comprises two interleaving conductive grates.

FIG. 7 illustrates an alternative arrangement. In FIG. 7, the isolated shielding structure 53 is composed of two interleaving conductive grates 531 and 532. These conductive grates are not connected galvanically to each other or the silicon substrate 51. Suitably, the conductive grates each have an interdigital interleaving structure. The isolated shielding structure may alternatively be composed of more than two interleaving conductive grates. In FIG. 7, the connected shielding structure 54 is composed of two interleaving conductive grates 541 and 542. Suitably, the conductive grates each have an interdigital interleaving structure. Each conductive grate 541 and 542 is connected to ground or the silicon substrate by terminals T4 and T5. Although FIG. 7 illustrates an arrangement in which both the isolated shielding structure and the connected shielding structure are composed of interleaving grates, in alternative arrangements only one (either the isolated shielding structure or the connected shielding structure) is composed of interleaving grates. The other shield may have any of the structures described with reference to FIG. 3, 5 or 6.

The density of the shields are chosen in dependence on the requirements of the RF component's performance.

FIGS. 1, 3, 5, 6 and 7 each illustrate two shielding structures. Suitably, the shielding system comprises at least one further isolated shielding structure having no galvanic connection to ground, the semiconductor substrate or the RF component. Suitably, the at least one further isolated shielding structure is positioned between the RF component and the connected shielding structure. Suitably, this isolated shielding structure is arranged as described with reference to the other isolated shielding structure. Suitably, the shielding system comprises at least one further connected shielding structure having a galvanic connection to ground or the semiconductor substrate. Suitably, the at least one further connected shielding structure also has a galvanic connection to the RF component.

The exemplary shielding structures described thus far describe an electrically isolated shielding structure located between the RF component and the electrically connected shielding structure. However, enhanced shielding of the RF component without increasing the frequency dependence of the SRF and Q-factor is also achievable in configurations in which the electrically connected shielding structure is located between the RF component and the electrically isolated shielding structure. Both the electrically connected shielding structure and the electrically isolated shielding structure shield the RF component in both configurations. Thus, each of the arrangements described with reference to FIGS. 3, 5, 6 and 7 may alternatively be arranged such that the described electrically connected shielding structure is located between the described RF component and the described electrically isolated shielding structure.

In the examples described above, the inductor terminal T4 of the electrically connected shielding structure is connected to the ground rail GND of the RF component. In other words, the electrically connected shielding structure has a galvanic connection to ground. Alternatively, any one of the above examples could be implemented such that the electrically connected shielding structure has a galvanic connection to the semiconductor substrate. This may be achieved, for example, by physically embedding the electrically connected shielding structure in the semiconductor substrate.

In each of the examples described above, the RF component is embedded in the semiconductor substrate. Alternatively, the RF component is above the semiconductor substrate. Alternatively, the RF component is positioned on the semiconductor substrate. In the examples described above, the RF component is an inductor that is positioned on a different layer of the shielded system to the layers comprising the shielding structures. Suitably, the inductor is a planar inductor. Suitable layouts of the inductor are spiral and figure-of-8.

The isolated shield and the connected shield are preferably positioned in different layers of the shielded system. Suitably, these layers are arranged such that both the isolated shield and the connected shield are embedded in the semiconductor substrate. Alternatively, the connected shield is embedded in the semiconductor substrate and the isolated shield is above the semiconductor substrate. Alternatively, the connected shield and the isolated shield are above the semiconductor substrate.

Thus, the present disclosure relates to a shielding system for reducing the energy dissipation from an RF component into a semiconductor substrate without significantly shifting the SRF and frequency at the maximum Q-factor of the RF component, by utilising at least two shielding structures, at least one of those shielding structures being isolated (i.e. having no galvanic connection to the ground rail or the semiconductor substrate) and at least one of those shielding structures being connected (i.e. having a galvanic connection to the ground rail or the semiconductor substrate). The known solution to reducing current dissipation into the semiconductor substrate from an RF component is to include a single connected shield into the system. Given that the introduction of this shield leads to the undesirable frequency dependence of the SRF and the Q-factor, it might be expected that further shielding would exacerbate the frequency dependency problem. However, the introduction of an electrically isolated shielding structure actually reduces the frequency dependence of the SRF and Q-factor.

The use of the connected shield and the isolated shield enables control over the Q-factor (and hence insertion loss) to be separated from control over the SRF. The composition of the connected shield can be optimized to increase the Q-factor and reduce the insertion loss. And the composition of the isolated shield can be optimized to limit the frequency dependence of the SRF.

The combination of the connected shield and the isolated shield can be used to control the parasitic coupling through the substrate between the RF component and neighbouring circuits. Furthermore this combination of shields can be used to control the out-of-band performance of the RF component.

Figure 1:
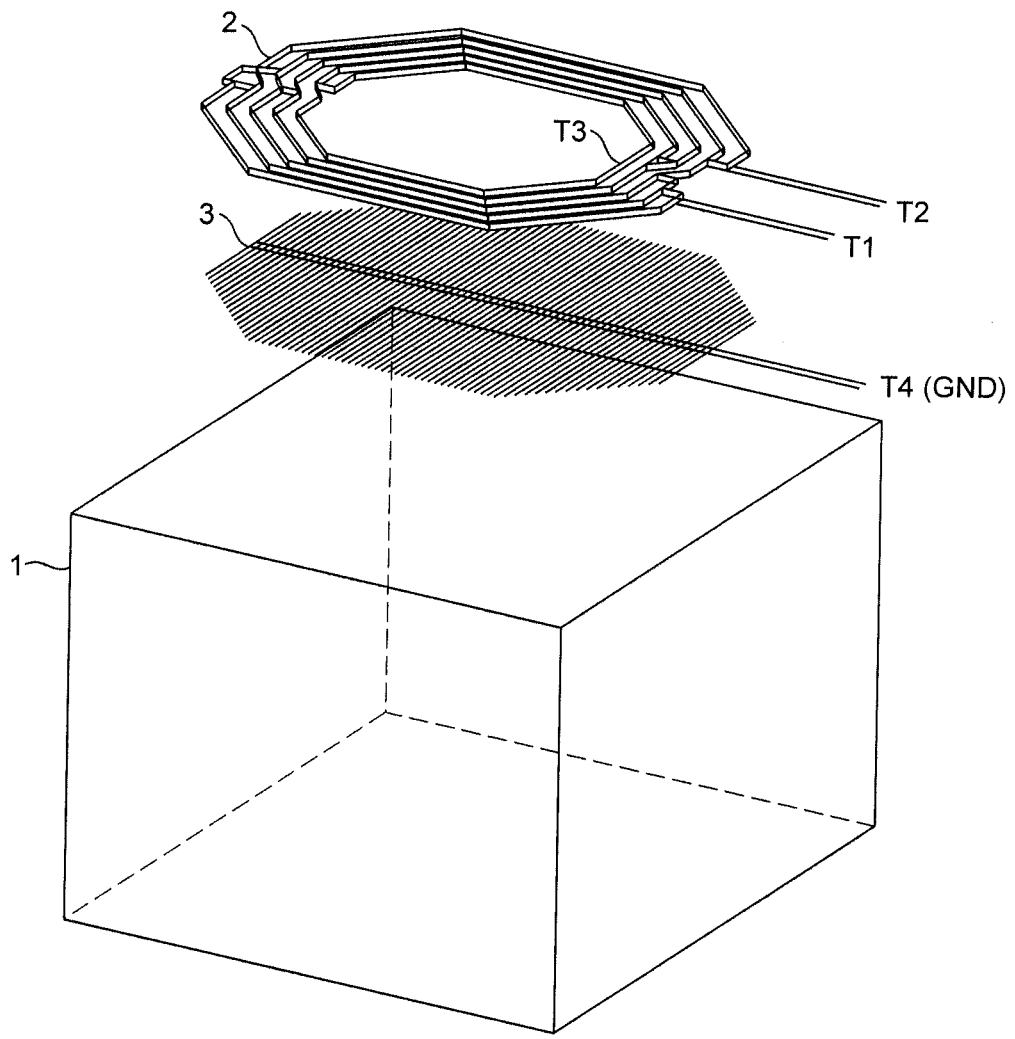
FIG. 1 illustrates a shielding arrangement comprising a single conductive grate as a shield.
Figure 2:
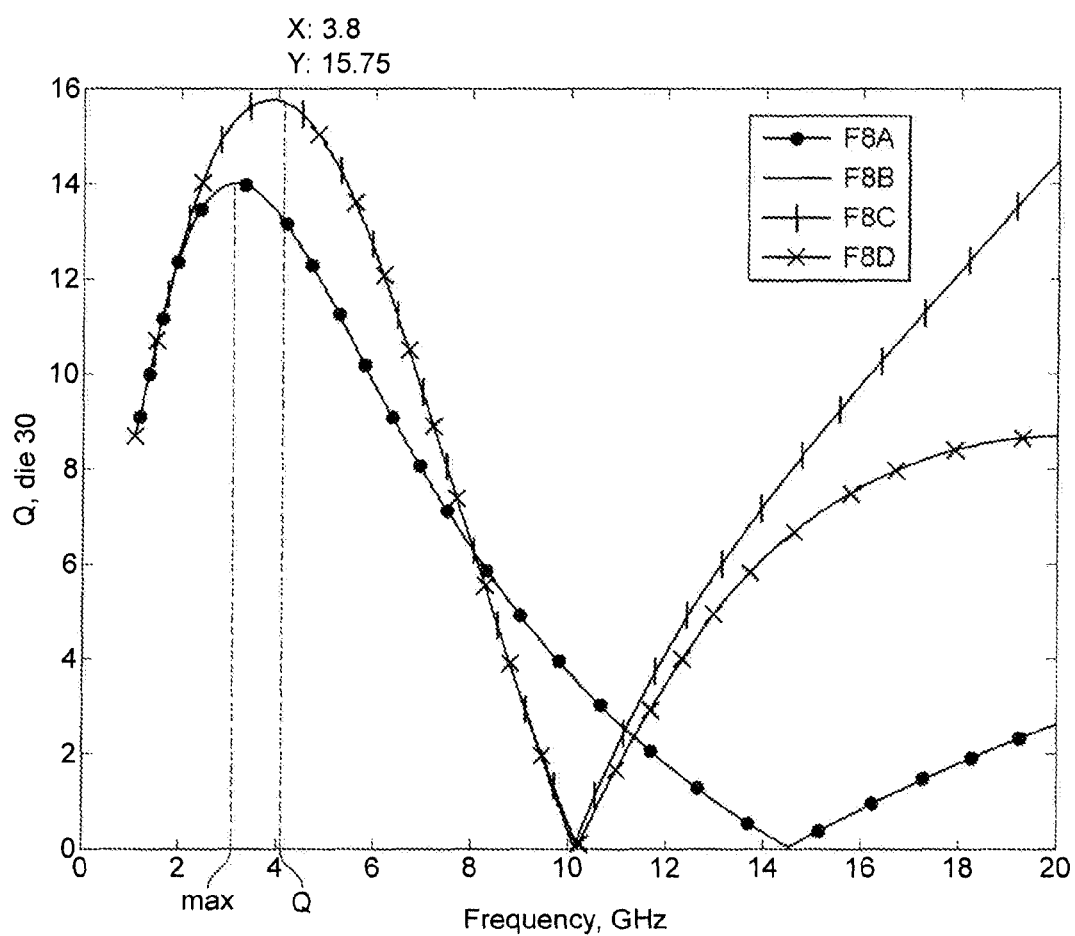
FIG. 2 illustrates the Q-factors of figure-of-8 inductors embedded in a silicon substrate both with and without a shielding grate.

The use of the combination of the connected shield and the isolated shield exhibits increased Q-factor performance compared to the connected-shield-only system of the prior art for the same area of inductor. The maximum Q-factor measured in FIG. 2 of the connected-shield-only system is comparable to the maximum Q-factors measured in FIG. 4 of the dual-shield arrangement, however the inductor in FIG. 2 had a footprint of almost double the size of the inductor in FIG. 4. Thus, the dual-shield arrangement disclosed herein can be utilised to save silicon area.

The dual-shield arrangement described herein could be used to implement an integrated circuit in which the entire integrated circuit design is migrated onto a more economical metal stack than the ultra thin membrane layers used to house RF components at the moment. This is achievable without any loss in performance or quality of the RF components as a result of the dual-shield arrangement. This is also achievable without any increase in the footprint of the component as a result of the dual-shield arrangement.

The shielded systems described above are suitable for use in voltage controlled oscillators (VCOs) and low noise amplifiers (LNAs).

The applicant draws attention to the fact that the present invention may include any feature or combination of features disclosed herein either implicitly or explicitly or any generalisation thereof, without limitation to the scope of any of the present claims. In view of the foregoing description it will be evident to a person skilled in the art that various modifications may be made within the scope of the invention.

The invention claimed is:

1. A shielded system for reducing energy dissipation from a radio frequency (RF) component into a semiconductor substrate, the shielded system comprising:
a semiconductor substrate;
an RF component coupled to the semiconductor substrate;
an electrically connected shielding structure having a galvanic connection to ground or the semiconductor substrate, the electrically connected shielding structure being electrically connected to the RF component; and
an electrically isolated shielding structure having no galvanic connection to ground, the semiconductor substrate or the RF component, wherein the electrically isolated shielding structure comprises a plurality of isolated conductive elements that are not galvanically connected.

2. The shielded system of claim 1, wherein each of the electrically connected shielding structure, the electrically isolated shielding structure, and the RF component is located in a respective non-overlapping layer of the shielded system.

3. The shielded system of claim 2, wherein the electrically connected shielding structure and the electrically isolated shielding structure are planar structures.

4. The shielded system of claim 3, wherein the electrically connected shielding structure is parallel to the RF component.

5. The shielded system of claim 3, wherein the electrically isolated shielding structure is parallel to the RF component.

6. The shielding system of claim 1, wherein the electrically connected shielding structure comprises a perforated grate.

7. The shielding system of claim 1, wherein the electrically connected shielding structure comprises a patterned grate.

8. The shielding system of claim 1, wherein the electrically isolated shielding structure comprises a plurality of isolated conductive elements located in close proximity to each other.

9. The shielding system of claim 8, wherein the plurality of isolated conductive elements have no galvanic connection to each other.

10. The shielding system of claim 1, wherein the electrically connected shielding structure comprises a plurality of connected conductive elements located in close proximity to each other.

11. The shielding system of claim 10, wherein the plurality of connected conductive elements are galvanically connected to each other.

12. The shielding system of claim 1, wherein the electrically isolated shielding structure comprises two interleaving conductive grates, the interleaving conductive grates having no galvanic connection to each other.

13. The shielding system of claim 1, wherein the RF component, the electrically connected shielding structure and the electrically isolated shielding structure are embedded in the semiconductor substrate.

14. The shielding system of claim 1, wherein the electrically connected shielding structure and the electrically isolated shielding structure are embedded in the semiconductor substrate and the RF component is not embedded in the semiconductor substrate.

15. The shielding system of claim 1, wherein none of the RF component, the electrically connected shielding structure and the electrically isolated shielding structure are embedded in the semiconductor substrate.

16. The shielding system of claim 1, wherein the semiconductor substrate is fabricated from silicon.

17. The shielding system of claim 1, wherein the RF component is an inductor.

18. The shielding system of claim 1, wherein the electrically isolated shielding structure is positioned between the RF component and the electrically connected shielding structure.

19. The shielding system of claim 1, wherein the electrically connected shielding structure is positioned between the RF component and the electrically isolated shielding structure.

20. An integrated circuit comprising the shielded system of claim 1.

* * * * *